United States Patent [19]
Kikuchi

[11] Patent Number: 5,999,006
[45] Date of Patent: Dec. 7, 1999

[54] METHOD OF AND APPARATUS FOR CONDUCTING ANALYSIS OF BURIED OXIDES

[75] Inventor: Hiroaki Kikuchi, Tokyo, Japan

[73] Assignee: NEC Corporation, Tokyo, Japan

[21] Appl. No.: 08/940,378

[22] Filed: Sep. 30, 1997

[30] Foreign Application Priority Data

Sep. 30, 1996 [JP] Japan ................................. 8-257918

[51] Int. Cl.⁶ .............................................. G01R 31/302
[52] U.S. Cl. .......................... 324/750; 324/96; 324/501; 324/753
[58] Field of Search .................................. 324/750, 753, 324/501, 514, 96

[56] References Cited

U.S. PATENT DOCUMENTS 4,125,440  11/1978  Markovits ............................. 205/791.5
4,431,967   2/1984  Nishioka ................................. 324/753
4,473,795   9/1984  Wood ...................................... 324/501

FOREIGN PATENT DOCUMENTS 7-86757   3/1995   Japan .

OTHER PUBLICATIONS

L.P. Allen et al., "Electrochemical Analysis of Simox Buried Oxides", Electrochemical Society Proceedings, vol. 96–3, pp. 18–27.

*Primary Examiner*—Josie Ballato
*Assistant Examiner*—T. R. Sundaram
*Attorney, Agent, or Firm*—Young & Thompson

[57] ABSTRACT

A beam of light is projected through an electrolyte to a SOI substrate to scan the surface of the SOI substrate. When the light passes through a pinhole in a buried oxide layer, the light excites a semiconductor layer beneath the buried oxides. An ammeter measures electric charges derived by this light excitation to indicate the presence of pinholes in the buried oxide.

7 Claims, 4 Drawing Sheets

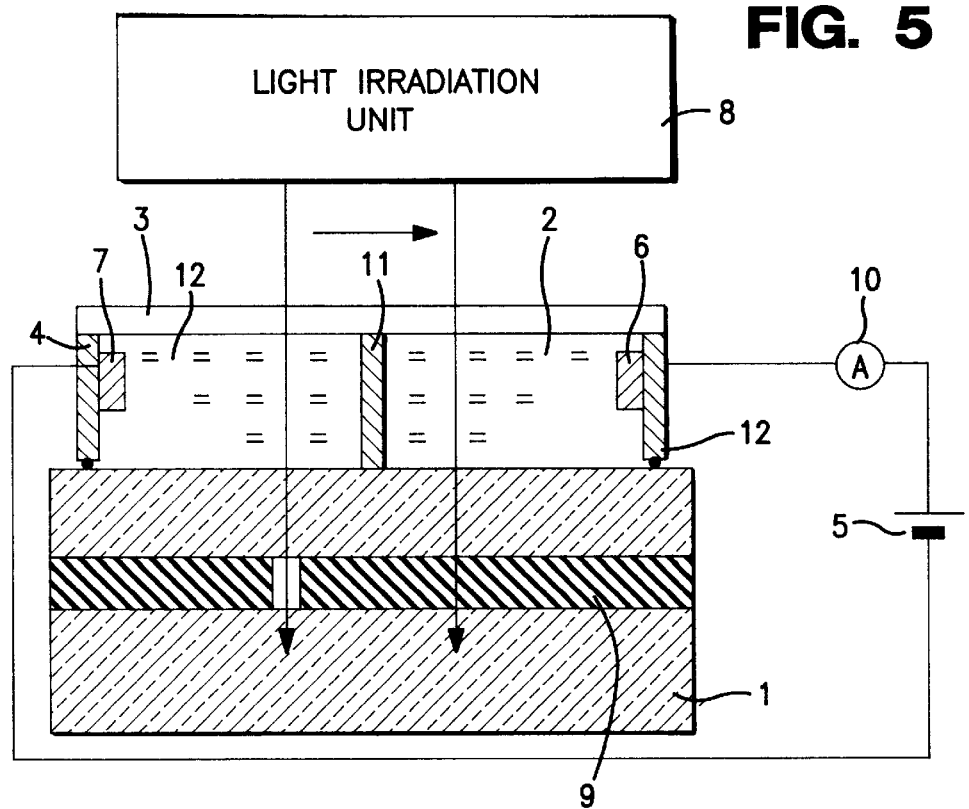
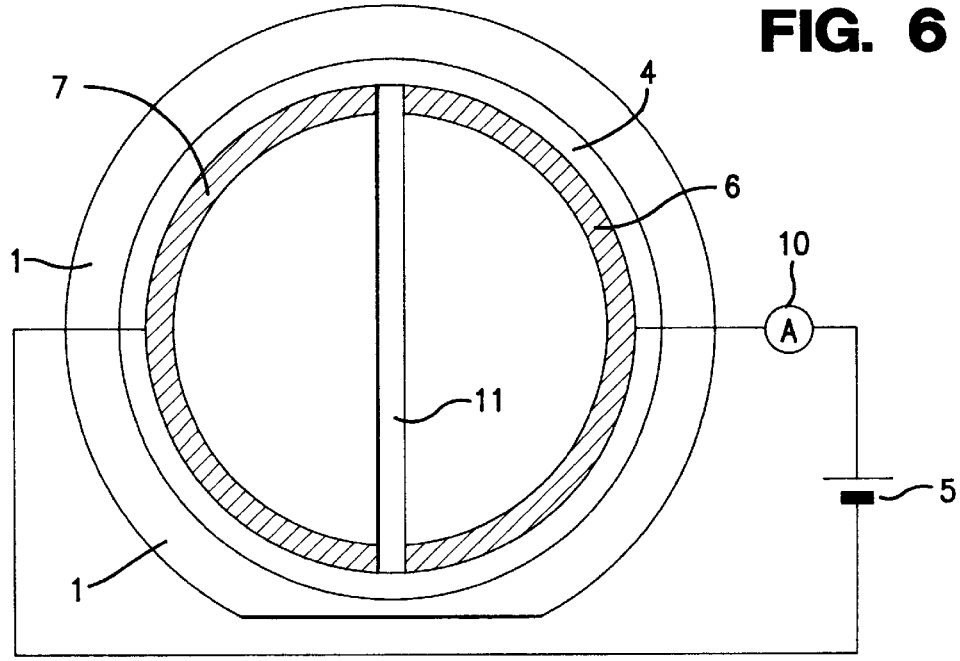

METHOD OF AND APPARATUS FOR CONDUCTING ANALYSIS OF BURIED OXIDES

BACKGOUND OF THE INVENTION

1. Field of the Invention

The present Invention relates to a method of and an apparatus for conducting analysis of insulator films, for example, buried oxides.

2. Description of the Related Art

Insulator films in semiconductor or SOI substrates are required to be sufficiently condensed. There tend to occur pinholes through insulator films due to film forming conditions. Such pinholes in insulator films cause insulator breakdown. Various proposals have been made to examine insulator films to find pinholes.

According to JP-A 7-86757, a frame is placed in liquid-tight manner on an insulator film that extends over a conductive layer on a substrate. Contained in the frame is test liquid including electrolyte and pH-indicator. A power supply with sufficient voltage is hooked up to an anode plate, immersed in the test liquid and a cathode probe pin connected to the conductor layer below the insulator film. Current flows through a pinhole in the insulator film. At the point of conduction above the pinhole, a colored spot will occur in the test liquid.

This method appears to be effective in determining the presence or absence of pinholes. However, it is difficult to evaluate the size of each pinhole and the number of pinholes owing to diffusion of colored spots. If, for example, two small pinholes lie in close proximity to each other, two colored spots spread into one spot.

An article entitled "ELECTROCHEMICAL ANALYSIS OF SIMOX BURIED OXIDES" by L. P. Allen et al., "Electrochemical Society Proceedings Volume 96-3" pages 18 to 27 (1996), explains an experimental set-up for electrolytic analysis of SIMOX or SOI wafer. A power supply with sufficient voltage is hooked up to an Al or Cu cathode and a Cu anode plate. Cleanroom Texwipes™ (Trade Mark), cut to fit an exclusion area of the wafer edge, are first highly soaked in a saturated copper sulfate solution. The Texwipes™ are placed on the top surface of the SIMOX substrate. The substrate, with surface tension attached Texwipes™, is placed face down upon the Cu anode. A drop of water is placed upon the backside of the wafer. The cathode weight is placed over the water drop to complete the circuit. Cu atoms are deposited on the Texwipes™ at the point of leakage current. The number of Cu plates is counted, divided by the area of the wafer, and a Cu plate density is obtained.

This method is found to be unsatisfactory because it takes a long time for Cu atoms to be deposited and Cu atoms are deposited on the buried oxides, failing to establish itself as a tool for quality control of substrate manufacturing.

An object of the present invention is to provide a method of and an apparatus for conducting analysis of insulator films, such as buried oxides, so that quick quantitative measurement of pinholes can be made.

SUMMARY OF THE INVENTION

According to one aspect of the present invention, there is provided a method of conducting analysis of a semiconductor substrate including a semiconductor layer under an insulator film, the method comprising the steps of:

immersing the insulator film of the semiconductor substrate to electrolyte;

projecting a spotlight through said electrolyte to the insulator film;

scanning the insulator film with said spotlight; and measuring electric charges that have been excited in the semiconductor layer and passed through the insulator film into said electrolyte.

According to another aspect of the present invention, there is provided an A method of conducting analysis of a semiconductor substrate including a semiconductor layer under an insulator film, the method comprising the steps of:

immersing the insulator film of the semiconductor substrate in an electrolyte;

projecting a spotlight through said electrolyte to the insulator film;

scanning the insulator film with said spotlight; and measuring electric charges that have been excited in the semiconductor layer and passed through the insulator film into said electrolyte.

According to still another aspect of the present invention, there is provided a method of conducting analysis of a semiconductor substrate including a semiconductor layer under an insulator film, the method comprising the steps of:

immersing the insulator film of the semiconductor substrate in an electrolyte;

projecting a spotlight through said electrolyte to the insulator film;

scanning the insulator film with said spotlight; and measuring electric charges that have been excited in the semiconductor layer and passed through the insulator film into said electrolyte.

BRIEF DESCRIPTION OF THE DRAWINGS

FIG. 5 is a similar view to FIG. 1 illustrating a third embodiment; and

FIG. 6 is a transverse section of FIG. 5.

DESCRIPTION OF THE PREFERRED EMBODIMENTS

Figure 1:
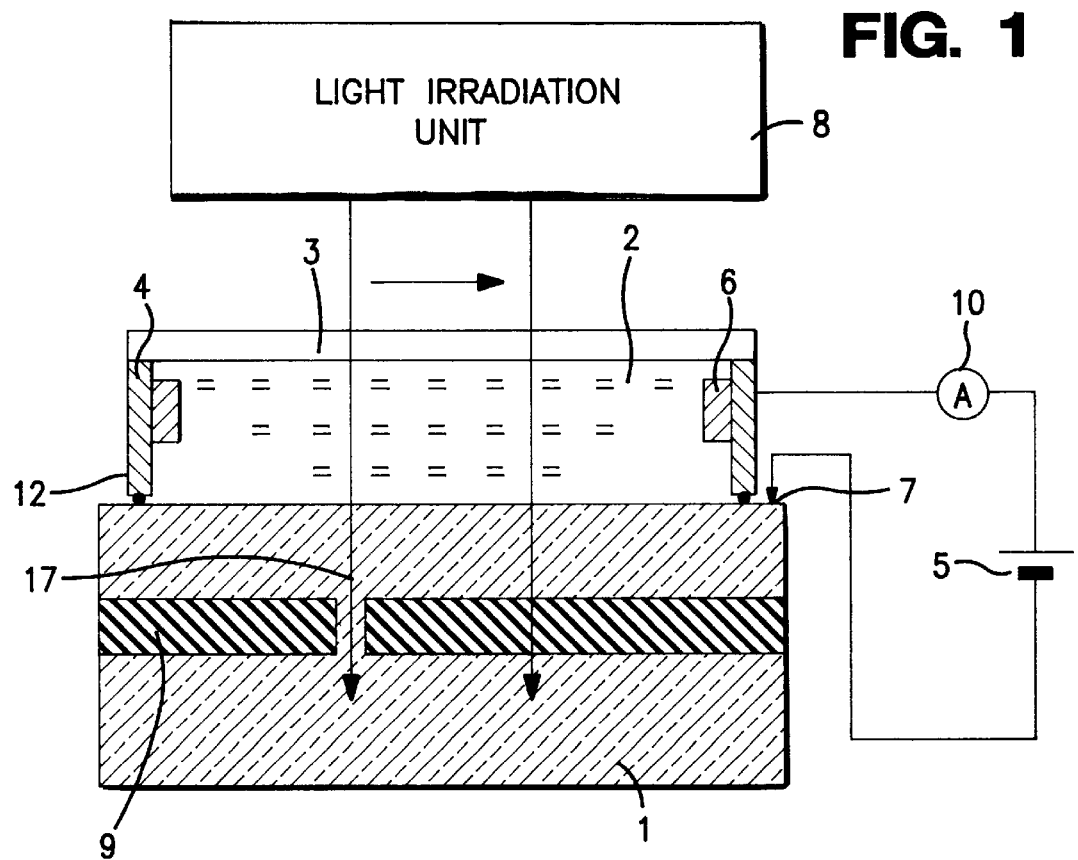
FIG. 1 is a vertical section of a first embodiment of an apparatus for conducting analysis of buried oxides.
Figure 2:
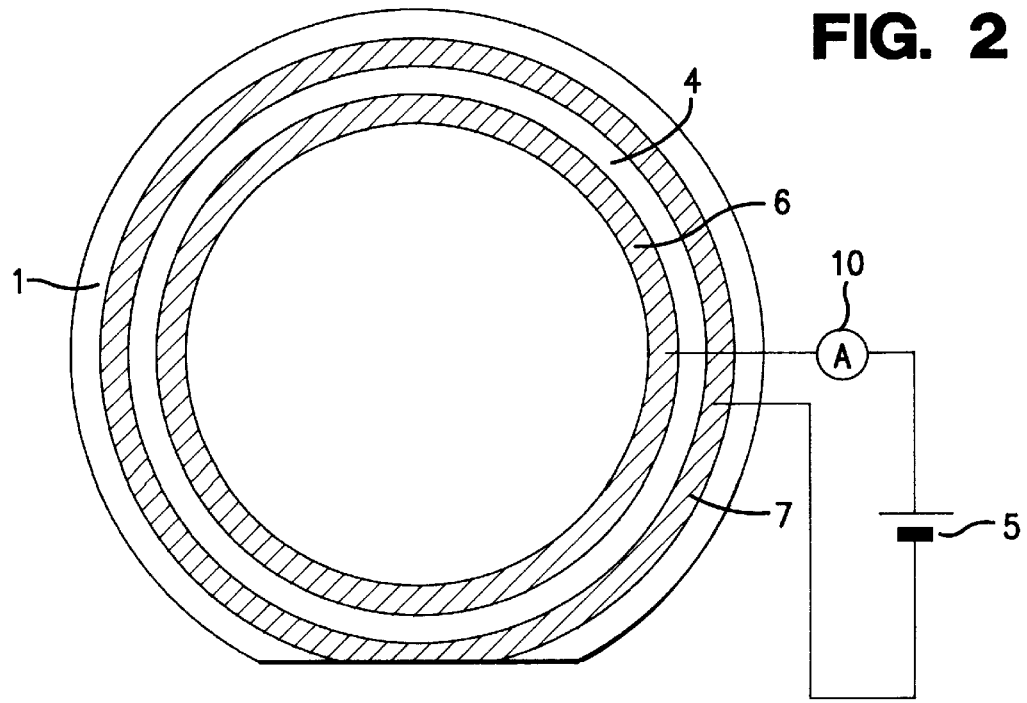
FIG. 2 is a transverse section of the apparatus shown in FIG. 1.

Referring to FIGS. 1 and 2, a SOI substrate 1 is illustrated. The top surface of the substrate 1 is exposed to electrolyte 2 contained in a cell that is defined by a frame 4 in cooperation with the top surface of the substrate 1. The frame 4 is placed on the top surface of the substrate 1 in liquid-tight manner via seal 12. A power supply 5 of sufficient dc voltage is hooked up to an anode electrode plate 6 that is immersed into the electrolyte 2 and a cathode electrode 7. The cathode electrode 7 is kept in contact with an ohmic electrode on the edge of the top surface of the SOI substrate 1 outside of the frame 4. A window 3 is placed on the frame 4 to keep the electrolyte 2 within the cell. A light irradiation unit 8 is provided above the window 3. The light irradiation unit 8 projects a spotlight on the top surface of the SOI substrate 1 through the window 3 and moves the spotlight. An ammeter 10 is provided to measure electric current upon completion of the circuit.

The window 3 prevents electrolyte 2 from flowing out of the frame 4. Supply of electrolyte 2 to the inside of the frame 4 is effected through a supply pipe by a pump, not shown.

The light irradiation unit 8 may include a white light lamp, a light irradiation head composed of a condensing lens and a relay lens, and a mirror that reflects the condensed light from the light irradiation head to project a spotlight on the SOI substrate 1 for scanning movement. The spotlight projected on the SOI substrate 1 can move in one direction. The SOI substrate 1 is placed on a carriage and can travel in a direction orthogonal to the scanning direction of the spotlight. Thus, the whole area of the top surface of the substrate can be exposed to the spotlight owing to the scanning movement of the spotlight and travel of the carriage.

The white light, which is considered to be a good tool for obtaining light excited current at high efficiency, requires an expensive light irradiation head including a light condensing arrangement. Thus, in the preferred embodiment, a He—Ne (helium neon) laser oscillator, which is available at low cost on the market, is used as the light irradiation unit 8.

The manner of conducting analysis of buried oxides of SOI substrate 1 is explained. First of all, a SOI substrate 1 with buried oxides 9 is placed on a carriage, not shown. Frame 4 is placed on the top surface of the SOI substrate 1 and its window 3 is closed. Electrolyte 2, for example, 1% diluted hydrofluoric acid solution or diluted acetic acid solution, is supplied to the inside of the frame 4 by a pump, not shown, So that the electrolyte covers the top surface of the SOI substrate 1.

Anode electrode plate 6, which is connected to positive side of dc power supply 5 and immersed in the electrolyte 2, and cathode electrode 7, which is connected to negative side of the power supply 5, are biased with dc voltage. That is, voltage is applied between the electrolyte 2 and the cathode electrode 7. Spotlight projected through the window 3 and the electrolyte 2 by light irradiation unit 8 to the SOI substrate 1 moves in the scanning direction. If the spotlight moves to a pinhole 17 in the buried oxides 9, a reading of electric current at ammeter 10 increases. An oscilloscope observes this increase in the form of a pulse-like wave.

Figure 3:
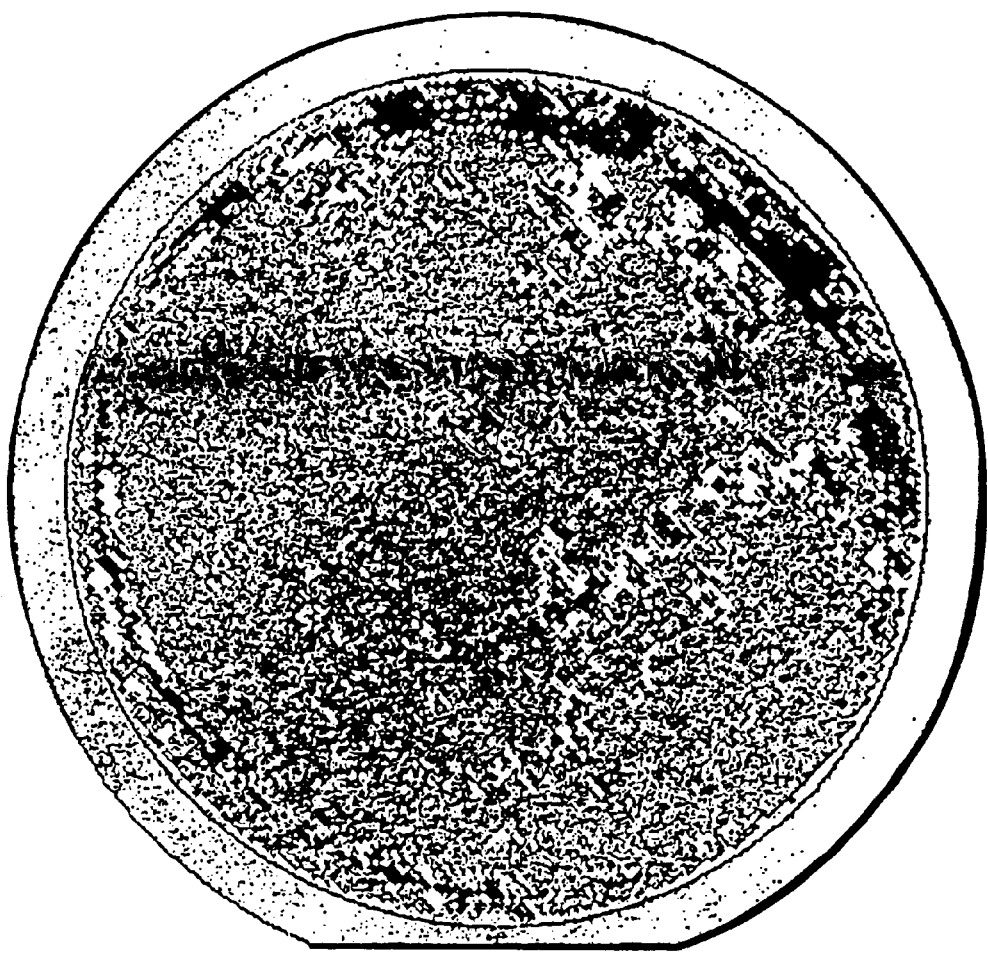
FIG. 3 is a view of a display showing locations of pinholes in buried oxides of SIMOX substrate.

FIG. 3 is a view observing buried oxides of SIMOX (Separation by Implanted Oxygen) substrate with pinholes.

The first embodiment is further described. The SOI substrate 1 shown in FIGS. 1 and 2 is a p-type substrate with carrier life time in the neighborhood of 30 Ms. As the electrolyte 2, a 1% HF solution (49% $HF:H_2O$) or a 1% acetic acid solution is used. Voltage of 5 V is applied across the electrolyte 2 and the cathode electrode 6 by the power source 5. The anode electrode 6 and the electrolyte 2 are positively biased, while the cathode electrode 7 is negatively biased. As the light irradiation unit 8, a laser oscillator is used which generates a laser beam with a wavelength of 670 nm and a spot diameter of 1 mm. The reason why the diameter of the spot is 1 mm is to provide resolution of 1 pinhole/mm.

Speed at which the spotlight moves is set so that two pinholes spaced a distance in the neighborhood of 1 mm can be detected separately. If the spotlight moving speed is high as compared to the lifetime of carrier, the excited carriers due to one pinhole occur before the excited carriers due to the other pinhole disappear. This overlap increases the possibility that the two pinholes are detected as one big pinhole.

In the present embodiment, therefore, the setting is made that the spotlight moving speed is 25 mm/s taking it into account that carrier lifetime of the substrate is in the neighborhood of 30 $\mu$s. With this speed, it took approximately 15 minutes to scan the whole surface area of the substrate. If the distance between the adjacent two pinholes is 1 mm, a limit spotlight moving speed is expressed by 1 mm/30 $\mu$s=33.3 m/s. Thus, the spotlight moving speed is allowed to increase to 30 m/s, shortening time required for the spotlight to scan the whole surface area of the substrate.

Variations of reading of current at the ammeter 10 are observed via oscillograph or display. FIG. 3 shows locations of pinholes at white portions where the measured current is great.

Figure 4:
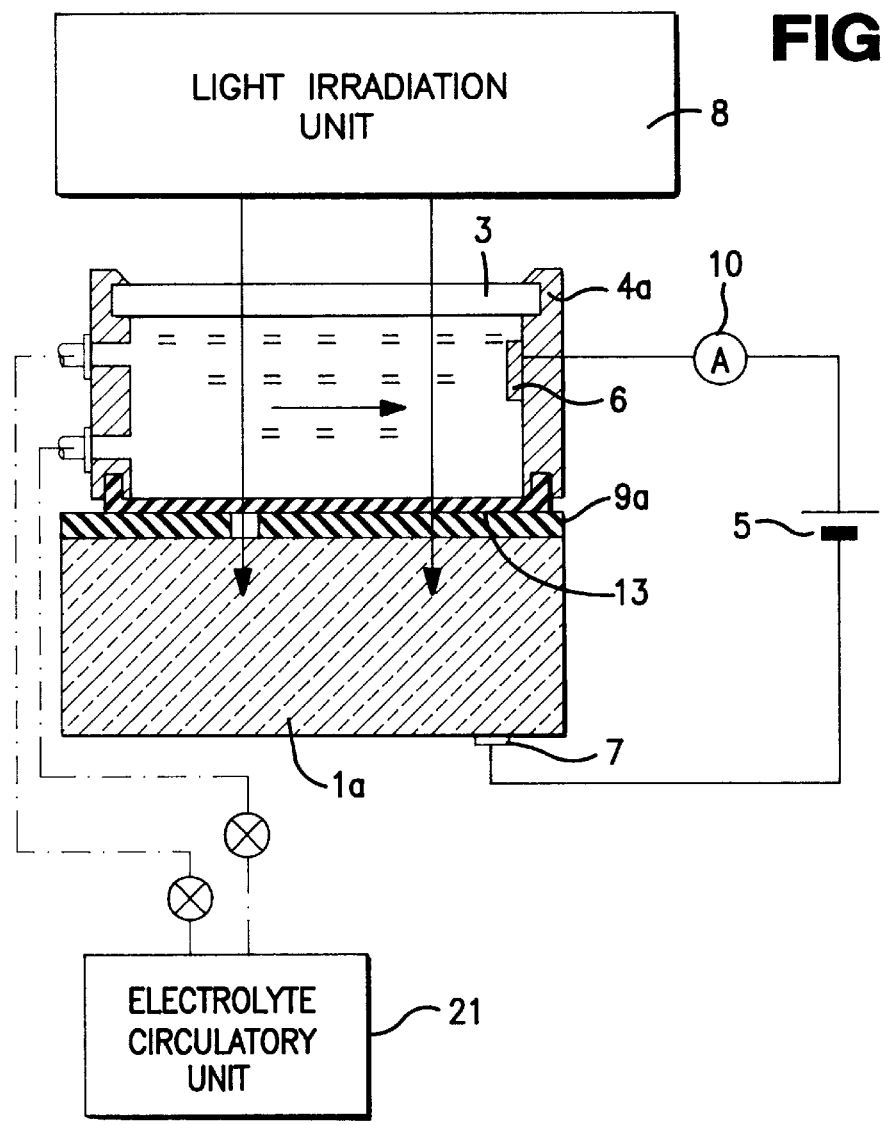
FIG. 4 is a similar view to FIG. 1 Illustrating a second embodiment.

Referring to FIG. 4, the second embodiment is described. This second embodiment is substantially the same as the first embodiment except the provision of a conductive sheet 13 that is transparent and elastic and the provision of an electrolyte circulatory unit 21.

The conductive sheet 13 is stretched on the bottom end of a frame 4a in direct contact with an insulator film 9a of a substrate 1a. The electrolyte circulatory unit 21 is provided to develop pressure in body of electrolyte 2 within the frame 4a to press the conductive sheet 13 against the insulator film 9a.

The conductive sheet 13 is made of ethylene vinyl acetate containing graphite. The electrolyte circulatory unit 21 includes a compact bellows pump and a reservoir tank that stores electrolyte from the frame 4a. Activating the pump fills the inside of the frame 4a with electrolyte, urging the conductive sheet 13 into firm and close engagement with concave and convex surface of the insulator film 9a expelling air from the interface. This minimizes loss of light beam.

Discharge of electrolyte from the Inside of the frame 4a is initiated by activating the pump with a drain side valve opened and a supply side valve closed. Thus, recovery of electrolyte is simple. Another advantage is that what is required is to operate the valves and the pump to contact and separate the conductive sheet 13 with and from the insulator film 9a. This fits requirements for automation. The second embodiment is different from the first embodiment in that a cathode electrode 7 contacts with an ohmic electrode formed on the backside of the substrate 1a.

Referring to FIGS. 5 and 6, a third embodiment is described. The third embodiment is substantially the same as the first embodiment except the provision of a partition 11 and the arrangement of an electrode plate 7. The partition 11 divides the inside of a frame 4 into two sections, namely a left-hand section and a right-hand section, viewing in FIGS. 5 and 6. An electrode plate 6 is immersed into electrolyte 2 within the right-hand section inside the frame 4, and another electrode plate 7 is immersed Into electrolyte 12 within the left-hand section inside the frame 4. A power source 5 of sufficient voltage is hooked up to the electrode plates 6 and 7. The polarity of the power source 5 switches in response to which one of left-hand and right-hand sections the beam of light passes through. When the beam of light passes through the left-hand section inside the frame 4, the electrode plates 6 and 7 are connected to positive and negative sides of the power source, respectively. When the beam of light passes through the right-hand section, the electrode plates 6 and 7 are connected to negative and positive sides of the power source, respectively.

According to the third embodiment, no electrode is attached to a substrate 1. Thus, contamination of substrate by metals is suppressed. If desired, a set of a light irradiation unit and a measurement circuit may be arranged for each of the left-hand and right-hand sections inside the frame 4. In this case, analysis of the substrate 1 below the left-hand section can be conducted simultaneously with analysis of the substrate below the right-hand section, thus shortening time required for analysis of the whole of the substrate.

In this third embodiment, the same electrolyte as used in the first embodiment fills in both the left-hand and right-hand sections inside the frame 4 and the SOI substrate of the p-type is used. The light irradiation unit 8 can project a laser beam with a wavelength of 670 nm and a spot diameter of 1 mm. When the laser beam passes through the left-hand section inside the frame 4, the electrode plate 6 is connected to the positive side of the power source 5 and the electrode plate 7 is connected to the negative side of the power source 5. Bias voltage of 5 V is applied across the electrode plates 6 and 7. When the laser beam passes through the right-hand section inside the frame 4, the electrode plate 6 is connected to the negative side of the power source 5 and the electrode plate 7 is connected to the positive side of the power source 5. An ammeter 10 measures current in the circuit.

Analysis of SIMOX substrate with buried oxides conducted according to the third embodiment has given substantially the same measurement results as those given according to the first embodiment.

In the case where no partition is used, the density of contamination of substrate by heavy metals is in the neighborhood of $10^{11}$ atoms/cm$^2$. The use of the partition has proven to be effective in reducing the density of contamination by heavy metals down to a level not exceeding $10^{10}$ atoms/cm$^2$.

From the preceding description, it is now understood that insulator film and semiconductor below the insulator film are involved in interference with electrolyte and beam of light. Thus, the insulator film and the semiconductor layer are free from damage and contamination.

Ammeter measures electric charges that have occurred due to excitation of semiconductor layer by a beam of light penetrated through a pinhole of insulator film. The density of pinholes can be evaluated quantitatively without any difficulty and without any delay.

What is claimed is:

1. A method of analyzing a semiconductor substrate having a semiconductor layer under an insulator film, the method comprising the steps of:

stretching an electrically conductive, transparent, and elastic sheet across an open surface of a frame;

placing the frame on a surface of the semiconductor substrate with the sheet contacting the surface of the semiconductor substrate;

placing an electrolyte in the frame;

projecting a beam of light through the electrolyte and the sheet to the surface of the semiconductor substrate;

scanning the surface of the semiconductor substrate with the light; and measuring electric charges that have been excited in the semiconductor layer and passed through the insulator film and the sheet into the electrolyte.

2. A method as claimed in claim 1, wherein a time required for the light to move a distance as long as a beam diameter of the light is longer than a carrier lifetime of the semiconductor layer.

3. An apparatus for analyzing a semiconductor substrate having a semiconductor layer under an insulator film, comprising:

a frame placed in liquid-tight manner on a surface of the semiconductor substrate;

a conductive sheet, which is transparent and elastic, stretched on said frame in contact with the surface of the semiconductor substrate;

an electrolyte disposed within said frame;

a light irradiation unit projecting a beam of light through said electrolyte and said sheet to the semiconductor substrate to scan the insulator film;

an electrode plate immersed in said electrolyte;

an ohmic electrode on the semiconductor layer;

a power source connected to said electrode plate and to said ohmic electrode to apply voltage thereacross; and an ammeter connected to measure a current passing between said electrode plate and said ohmic electrode.

4. An apparatus for conducting analysis of a semiconductor substrate including a semiconductor layer under an insulator film, comprising:

a frame placed in liquid-tight manner on the semiconductor substrate;

a partition dividing the inside of said frame into a first section and a second section;

a first body of electrolyte disposed within said first section within said frame;

a second body of electrolyte disposed within said second section within said frame;

a light irradiation unit projecting a beam of spotlight to the semiconductor substrate through one of said first and second bodies of electrolyte to scan the insulator film;

a first electrode plate immersed Into said first body of electrolyte;

a second electrode plate immersed into said second body of electrolyte;

a power source hooked up to said first and second electrode plates to apply voltage thereacross; and an ammeter circuited to measure current passing between said electrode plate and said ohmic electrode, the polarity of said power source being operative to switch in response to which one of said first and second bodies of electrolyte said beam of spotlight passes through.

5. The apparatus of claim 3, further comprising an electrolyte circulatory unit connected to said frame.

6. The apparatus of claim 3, wherein said electrode plate is an annular ring attached to an interior surface of said frame.

7. The method of claim 1, further comprising the step of circulating the electrolyte into and out of the frame.

* * * * *